US 6,569,775 B1

(12) United States Patent
Loewenhardt et al.

(10) Patent No.: US 6,569,775 B1
(45) Date of Patent: May 27, 2003

(54) METHOD FOR ENHANCING PLASMA PROCESSING PERFORMANCE

(75) Inventors: Peter K. Loewenhardt, San Jose, CA (US); John M. Yamartino, Palo Alto, CA (US); Hui Chen, Santa Clara, CA (US); Diana Xiaobing Ma, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/506,065

(22) Filed: Feb. 17, 2000

Related U.S. Application Data

(60) Provisional application No. 60/126,837, filed on Mar. 30, 1999.

(51) Int. Cl.[7] ............................................. H01L 21/00
(52) U.S. Cl. ...................... 438/709; 216/63; 216/66; 216/75; 216/78; 438/712; 438/714; 438/720; 438/742; 156/345.24
(58) Field of Search .................. 438/707, 708, 438/709, 712, 714, 720, 742; 216/63, 66, 67, 75, 77, 78; 156/345.24, 345.26, 345.28, 345.29, 345.31

(56) References Cited

U.S. PATENT DOCUMENTS

| | | | |
|---|---|---|---|
| 4,183,780 A | | 1/1980 | McKenna et al. .......... 156/643 |
| 4,643,799 A | * | 2/1987 | Tsujii et al. ............. 438/708 X |
| 4,668,337 A | | 5/1987 | Sekine et al. ............. 156/643 |
| 4,699,689 A | | 10/1987 | Bersin ....................... 156/643 |
| 4,738,748 A | | 4/1988 | Kisa .......................... 156/643 |
| 4,915,777 A | | 4/1990 | Jucha et al. .............. 156/643 |
| 4,976,930 A | | 12/1990 | Kishida et al. ........... 422/186.3 |
| 5,217,559 A | | 6/1993 | Moslehi et al. ........... 156/345 |
| 5,273,609 A | | 12/1993 | Moslehi ..................... 156/345 |
| 5,401,357 A | | 3/1995 | Okuhira et al. ........... 156/643 |
| 5,515,985 A | * | 5/1996 | Ohshita et al. ........... 438/709 X |
| 5,522,935 A | | 6/1996 | Sato ......................... 118/723 MP |
| 5,534,107 A | | 7/1996 | Gray et al. ................ 156/643.1 |
| 5,607,601 A | * | 3/1997 | Loper et al. ................ 438/708 |
| 5,705,443 A | * | 1/1998 | Stauf et al. ............... 438/720 X |
| 5,814,238 A | * | 9/1998 | Ashby et al. ............. 438/708 X |
| 5,897,844 A | | 4/1999 | Amme et al. .............. 422/186 |
| 6,153,529 A | * | 11/2000 | Agarwal .................... 438/708 |

FOREIGN PATENT DOCUMENTS

| | | |
|---|---|---|
| EP | 0 212 924 A2 | 3/1987 |
| EP | 0 632 488 A1 | 1/1995 |
| JP | 56037629 | 4/1981 |
| JP | 56105480 | 8/1981 |
| JP | 01064224 | 3/1989 |
| JP | 05102101 | 4/1993 |
| JP | 05243160 | 9/1993 |

OTHER PUBLICATIONS

Choi K –S et al: "Low Temperature Copper Etching Using an Inductively Coupled Plasma With Ultraviolet Light Irradiation" Journal of the Electrochemical Society, Electrochemical Society. Manchester, NH, US, vol. 145, No. 3, Mar. 1998, pp. L37–L39.

Lawing et al "The Mechanism of Copper Removal from a Bare Silicon Surface with Ultraviolet Excited Chlorine" Electrochemical Society Proceedings, vol. 97–35, pp 299–303.

* cited by examiner

*Primary Examiner*—William A. Powell
(74) *Attorney, Agent, or Firm*—Moser, Patterson, and Sheridan; Joseph Bach

(57) ABSTRACT

A method of improving plasma processing of a semiconductor wafer by exposing the wafer or the plasma to photons while the wafer is being processed. One embodiment of the method comprises the steps of etching an aluminum layer and, during the etching, exposing the semiconductor wafer containing the aluminum layer to photons that photodesorb copper chloride from the surface of the layer thus improving the etch process performance.

28 Claims, 4 Drawing Sheets

METHOD FOR ENHANCING PLASMA PROCESSING PERFORMANCE

CROSS REFERENCE TO A RELATED APPLICATION

This application claims benefit of United States Provisional Application No. 60/126,837, filed Mar. 30, 1999, and is hereby incorporated by reference in its entirety.

This application additionally is related to U.S. patent application Ser. No. 09/280,462, filed on Mar. 30, 1999, contemporaneously with the above referenced Provisional Application No. 60/126,837, entitled "METHOD FOR REDUCING TOPOGRAPHY DEPENDENT CHARGING EFFECTS IN A PLASMA ENHANCED SEMICONDUCTOR WAFER PROCESSING SYSTEM", and is hereby incorporated by reference in its entirety.

BACKGROUND OF THE DISCLOSURE

1. Field of the Invention

The invention relates to semiconductor wafer processing systems and, more particularly, the invention relates to a method of improving plasma processing performance.

2. Background of the Invention

As structures fabricated upon semiconductor wafers become smaller and the wafers become larger, there are many factors that contribute to non-optimal processing of the wafers. To improve processing throughput of wafers (e.g., increase the number of wafers processed within a unit of time), it is desirable to, for example, further increase the etch rate, decrease the chamber cleaning frequency, decrease chamber cleaning duration. Furthermore, any improvements to the process results, such as improvements in electron shading, improved photoresist selectivity, decreased photoresist striations, residue control, chamber cleanliness, aspect ratio dependent etching, substantially reduced charging damage, mitigating notching, improved profile control, improved etch stop, decreased microloading, mitigation of gap fill difficulties and the like, are desirable.

As an example of a desired improvement, as structures fabricated upon semiconductor wafers are reduced in feature size, residue control during aluminum etching has become a serious issue. Some aluminum films generally contain a small amount of copper, i.e., 0.5 to 2 percent, which can result in residue formation that can interfere with further processing that is required to complete an integrated circuit. During an aluminum etch process, the aluminum etch rate and by-product removal rate is much faster than those of copper. Therefore, copper residues are easily formed especially in an aluminum alloy where copper segregation typically occurs. The residues form in the copper rich areas of the aluminum alloy. The mechanism for producing copper-induced residue is the following: copper in the aluminum-copper alloy is harder to etch and is not necessarily evenly distributed throughout the alloy. Local concentrations of copper are harder to etch and sacrifice etch rate, resist selectivity, and profile control. Such non-uniform etching results in some regions of the final etched product becoming raised regions with respect to surrounding regions. Such raised regions are referred to as "residue". The residue may not have any copper in it at all but was the result of the copper in the aluminum.

The wafer can be heated to higher temperatures to enhance copper etch by-product removal as well as the removal of more volatile by-products. However, for temperatures above approximately 130° C., the photoresist will reticulate, and even for small temperature rises above the optimal for process control, process factors are difficult to control, for example, the aluminum stack profile. Another conventional method of addressing this issue is to increase the ion bombardment of the wafer. However, additional ion bombardment occurs at the expense of resist selectivity and profile microloading.

Therefore, a need exists in the art for a method of generally improving processing of semiconductor wafers, an example of which is reducing copper-induced residue produced during aluminum etching.

SUMMARY OF THE INVENTION

The disadvantages associated with the prior art are overcome by the present invention of a method for reducing plasma process related effects that impact both wafer processing and the structures produced by the process. The method comprises the steps of plasma processing a semiconductor wafer and exposing the semiconductor wafer or the plasma to photons to facilitate improvement of the process.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
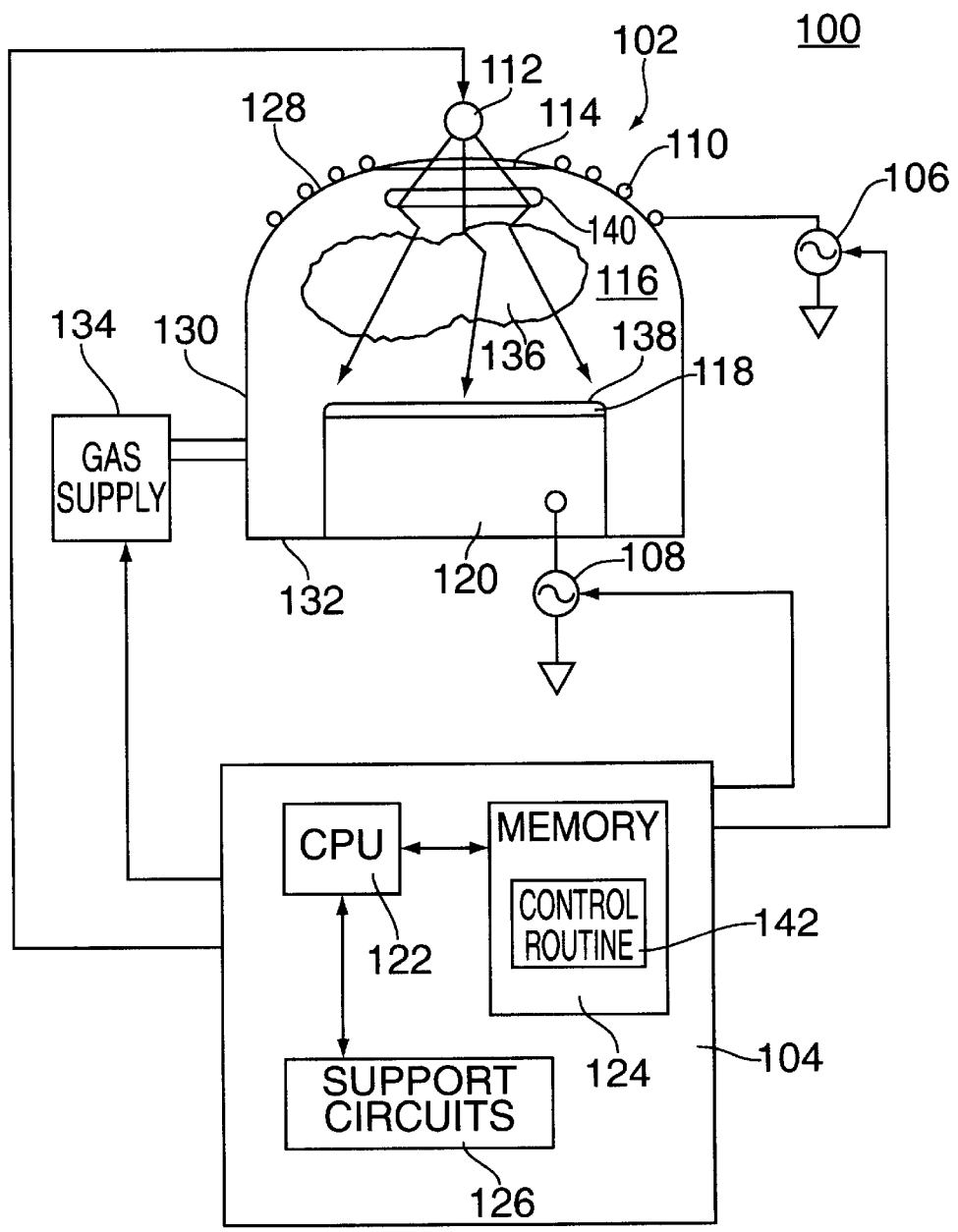
FIG. 1 depicts a schematic view of an illustrative semiconductor wafer processing chamber that is used to practice the present invention.

FIG. 1 depicts a schematic diagram of a plasma enhanced semiconductor wafer processing system 100. The depicted system is illustratively an inductively coupled plasma etch system. The invention, however, is equally applicable plasma deposition chambers, capacitively coupled chambers, magnatron, helicons and other plasma processing systems that can be improved by exposing the wafer to photons.

The system 100 comprises a process chamber 102, a source power supply 106, a bias power supply 108, and a controller 104. The process chamber 102 comprises a pedestal 120, an antenna 110, a light source 112, a gas supply 134 and a process volume 116 defined by a top 128, a cylindrical sidewall 130, and a bottom 132. The source power supply 106 couples an RF signal (e.g., 2 MHz) to the antenna 110. The antenna 110, having a plurality of turns located proximate the top 128, produces an RF magnetic field that excites a process gas (e.g., chlorine), or multiple gases, located in the volume 116 to form a plasma 136. A semiconductor wafer 118 containing a layer 138 (e.g., aluminum, oxide, polysilicon and the like) to be processed is supported upon the pedestal 120. The wafer 118 is exposed to the plasma to facilitate processing of material on the wafer 118, e.g., aluminum. The pedestal and thus the wafer is biased by an RF signal (e.g., 13.56 MHz) supplied to the pedestal 120 by the bias power supply 108.

A light source 112 forms a source of photons that are emitted into the volume 116 to impact the wafer 118. The light source 112 is one or more lamps that emit ultra-violet or infrared light. A lamp that is a source of ultra-violet light is a Mercury capillary lamp. Other sources (e.g., lamps) are also available that produce photons or particles of sufficient energy. Examples of such lamps include xenon lamps and tungsten filament lamps. The photons may be in the infrared, visible, ultraviolet, vacuum ultraviolet bands of the electromagnetic spectrum. Additionally, the energy or number of photons may be tuned to optimize process enhancements during particular processes. Also, the source of photons can be modulated to temporally vary the intensity, energy, or number of photons or particles. The source can also be induced from the plasma itself, resultant from adding specific chemicals to the plasma that emit specific required wavelengths.

In an illustrative embodiment, a ultra-violet lamp 112 producing, for example, 150 or more watts, is positioned at the top 128 of the chamber 102 proximate a window 114 that is transparent to ultra-violet light. With the use of other light sources in other embodiments, the window should be selected to be transparent to that source. In this embodiment, the wafer contains an aluminum layer and the process to be completed is a metal etch process. The amount of light may vary depending on the materials being processed and the wafer size. Alternately, the wafer may contain in place of the aluminum layers other semiconductor device materials such as tungsten, tungsten silicide, silicon, silicon dioxide, silicon nitride, silicon oxynitride, photoresist, titanium, titanium nitride, tantalum, tantalum nitride, copper and other thin film materials used in manufacturing integrated circuits either deposited or etched The photons (represented by arrows 140) from the lamp 112 pass though the window 114 and into the volume 116. The photons impact the wafer surface or chamber wall and photodesorb any copper chloride that is on the chamber walls 128, 130, and 132 or on the wafer 118. As is discussed below, the illumination of the wafer by the photons also facilitates other improvements in the processing of the wafer. The lamp 112 generally illuminates the wafer 118 during entire period of plasma processing; however, this is specific to this embodiment and is not necessarily required for the invention (i.e., the wafer may be exposed during only specific periods of the processing, or even as a post-etch or post-deposition treatment).

Controller 104 provides automated control of the system 100. The controller 104 comprises a central processing unit (CPU) 122 that is connected to a memory 124 and support circuits 126. The controller 104 is a general purpose computer that, when executing certain programs stored in the memory 124, becomes a specific purpose computer. Memory 124 may be random access memory, read only memory, disk drive storage, or any other form of storage that is used to store a digital program or any combination thereof. The support circuits 126 are well known elements of a computer including cache, power supplies, clock circuits, buses, and the like. The method of the present invention may be embodied in whole or in part in a program 142 that is stored in the memory 104. Although shown as embodied as a software program, the method of the present invention may comprise steps that are performed by software, hardware or a combination thereof.

Figure 2:
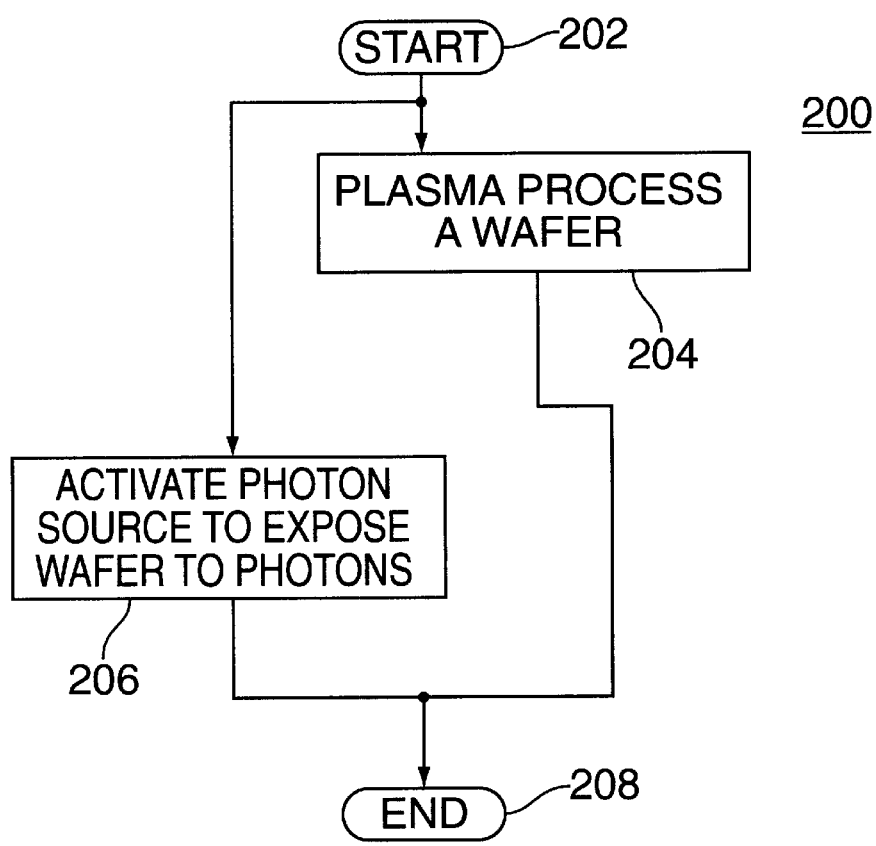
FIG. 2 depicts a flow diagram representing the method of the present invention.

FIG. 2 depicts a flow diagram of a routine 200 of an illustrative embodiment of the present invention. In this embodiment, the wafer is exposed to photons to cause photochemical desorption of copper chloride. However, the invention may be used to cause the photochemical desorption of many materials that may impede plasma processing of a semiconductor wafer. As such, copper desorption in an etch reactor should be considered illustrative of the many uses of the present invention. Furthermore, this application of the invention is merely illustrative of the benefits that the method brings to semiconductor wafer processing in general, as shall be discussed below.

The routine begins at step 202 and proceeds to step 204 wherein a wafer containing a layer of aluminum is etched by a chlorine-based plasma that has been excited in the process chamber. Those skilled in the art will realize that a plurality of steps are typical in exciting a plasma in a process chamber, i.e., supply a process gas (e.g., chlorine) or gases, apply source power to the antenna, apply bias power to the pedestal and so on. These steps are well within the skill in the art to perform without further explanation.

Once a plasma is excited, the wafer begins to be etched in a manner that forms copper chloride from impurities in the aluminum. At step 206, the routine 200 activates a 35 photon source throughout the wafer processing period, e.g., an ultraviolet or infrared lamp illuminates the wafer with high energy photons. The photons desorb the copper in the chamber and on the surface of the wafer in the form of a gas phase product. The desorption, as proposed in Lawing et al., "The Mechanism of Copper Removal from a Bare Silicon Surface with Ultra-Violet Excited Chlorine", Electrochemical Society Proceedings, Vol. 97–35, pp. 299–306, can be represented by the following:

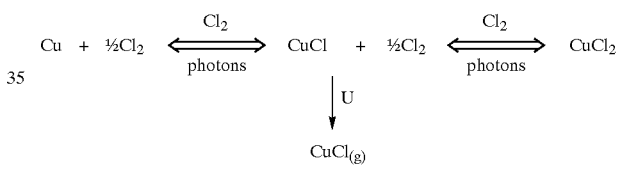

Accordingly, the CuCl that is produced by the desorption is a gas that is easily exhausted from the chamber by a vacuum pump. At step 208, the process stops and the routine awaits the next wafer that is to be processed.

Figure 3:
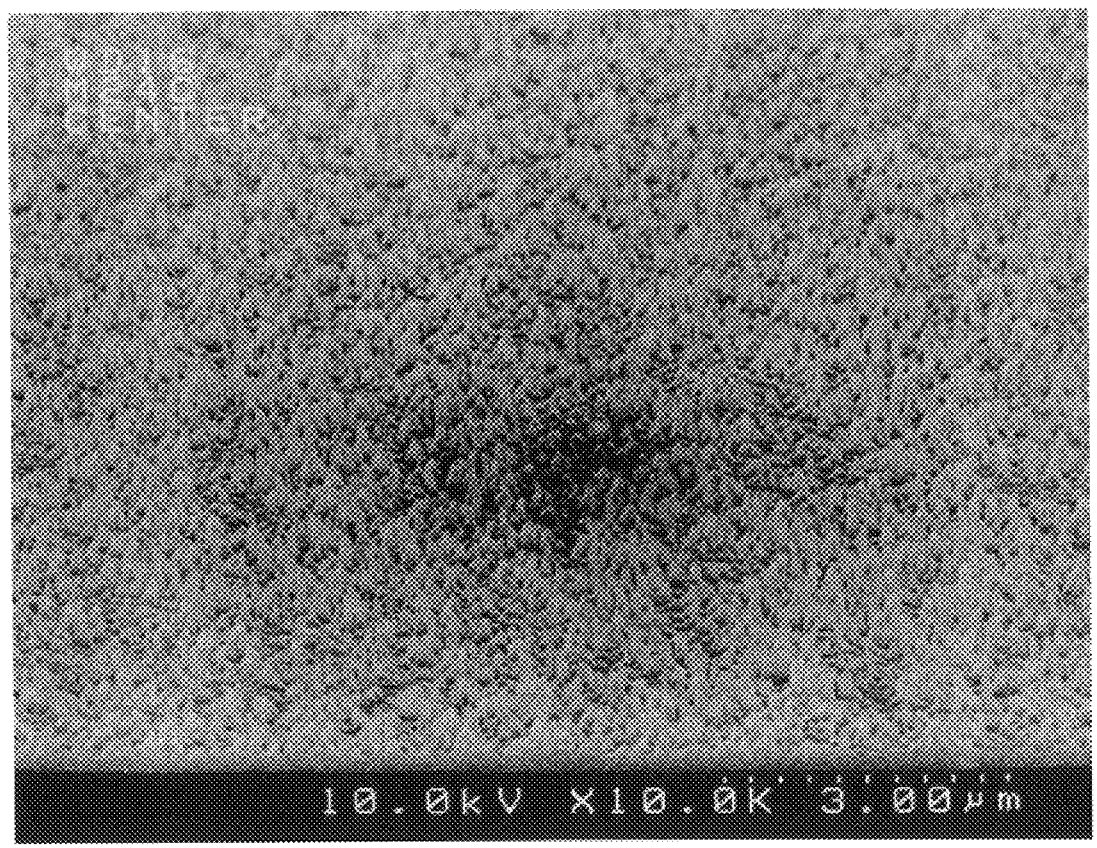
FIG. 3 depicts a scanning electron microscope (SEM) of an open area on a wafer that is not exposed to UV light during an aluminum etch process.
Figure 4:
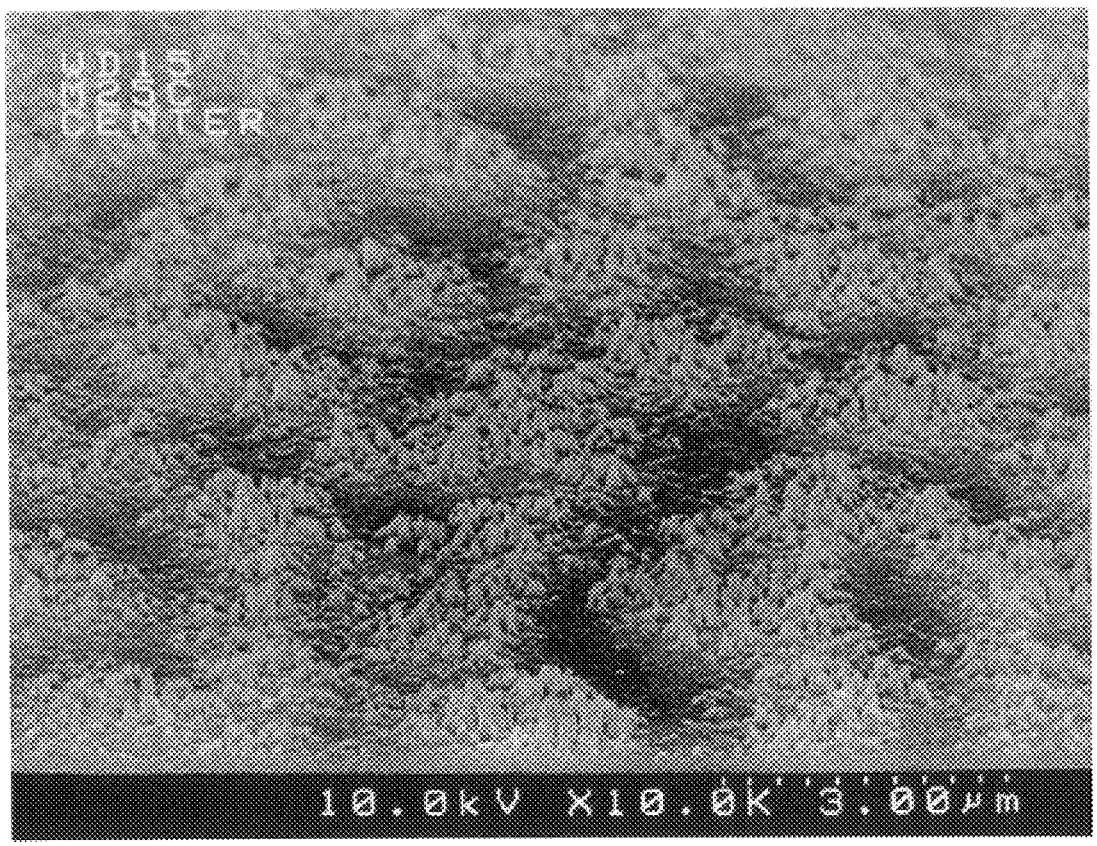
FIG. 4 depicts a SEM image of an open area on a wafer that was exposed to a 3000 Watt mercury capillary lamp during an aluminum etch process.

In one specific application of the invention, a lamp was coupled to a window located in the center of the dome of a DPS etch reactor manufactured by Applied Materials, Inc. The process recipe used to etch an aluminum stack was:

Chamber pressure: 10 mT
Bias power: 140 Watts
Source Power: 1400 Watts
Process gases: $Cl_2/BCl_2/Ar$ When the lamp was active during the entire etch process, the use of illumination resulted in a substantial reduction in the amount of copper-induced residue on the wafer. FIG. 3 depicts a scanning electron microscope (SEM) image of an open area on a wafer that is not exposed to light during an aluminum etch process. FIG. 4 depicts a SEM image of an open area on a wafer that was exposed to a 3 kW mercury capillary lamp during an aluminum etch process. The water receives about 150 Watts of radiant energy. In FIG. 4, it is clearly shown that the copper-induced residue (the white patches) is substantially reduced as compared to the SEM of FIG. 3. This technique would also improve copper etching by removing copper chloride from the chamber.

In addition to reducing the copper-induced residue, the use of a photon source also causes the etch rate to increase.

This increased etch rate is thought to be a result of the removal of copper-induced residue that may impede the aluminum etch process. Furthermore, the copper-induced residue that otherwise form upon the interior walls of the process chamber is also photodesorbed resulting in less contaminant accumulation on the walls. Also, the introduction of photons may have a direct influence on the amount and characteristics of chamber deposition. Because there is a reduction in the amount of accumulation of residue on the chamber walls, the chamber operates for a longer period of time between cleaning procedures and the throughput of the chamber is increased. Photons can assist the photochemical reaction occurring between etch by-products deposited on the chamber surfaces and cleaning reactants. As such, the chamber cleanliness and productivity is improved.

Additionally, it has been found that exposing the wafer to photons during processing improves aspect ratio dependent etching, and reduces charging damage. It may also reduce notching, improve profile control, improve photoresist selectivity as well as microloading, photoresist striations, and gap fill difficulties. As such, many aspects of semiconductor wafer processing are improved by exposing the wafer to photons during processing. The intensity, energy and number of the photons may be optimized to cause improvements to these various process aspects.

Furthermore, when etching an oxide film, the invention provides improved selectivity over silicon and silicon nitride. Generally speaking, when simultaneously etching polysilicon and oxide, the silicon and silicon nitride etch more easily than oxide due to the lower Si—Si and Si—N bond energies compared with Si—O bond energy. Consequently, the selectivity of oxide over silicon and silicon nitride is typically poor and requires a substantial amount of polymer to protect the silicon from etching. This results in a narrow process window and chamber dirtiness. However, by illuminating the wafer with photons during etching, the photons selectively enhance the oxide etch process over that of the silicon and silicon nitride etch process. As such, the selectivity of oxide over silicon and silicon nitride is improved.

Another improvement in wafer processing that results from using the invention when etching a wafer containing a photoresist material is that the photoresist material is further hardened (cured) by photon illumination as the etch process progresses. In essence, the invention provides an "in situ photoresist baking" process as etching progresses. Using such an in situ hardening technique improves the etch selectivity and, when etching oxide films, improves photoresist striation.

Another improvement in wafer processing that results from using the invention occurs when certain gases, e.g., organic ligands, are added to the chamber atmosphere and exposed to photons, e.g., ultra-violet. Such gases, when exposed to light, improve wafer process performance as well as the chamber cleaning process.

Also, a phenomenon known as notching is decreased when the invention is used during a plasma process. Notching occurs as a result of topographically dependent charging of a wafer and the structures on a wafer. One cause of topographically dependent charging is electron shading.

Electron shading is one of the main contributors to structure charging. Electron shading is associated with the formation of structures having a dense line pattern and having a high aspect ratio. Electron shading results from the isotropic movement of electrons in a process chamber during plasma processing, in contrast to the anisotropic movement of ions contained in the plasma. The electrons impact the sidewalls and other vertical surfaces of the structures and charge the structures. The high aspect ratio of these structures causes the upper portions near the plasma to be impacted by more electrons than the "deep" portions of the structure. As such, the "shading" of the deep portions results in a voltage differential over the structure. Such structure charging may result from the use of any plasma process to process a wafer. As a result, many plasma processes are capable of causing topography dependent charging damage of structures on a semiconductor wafer. This non-uniform charging causes notching as a structure is etched. As described in U.S. patent application Ser. No. 09/280,462, filed Mar. 30, 1999, and incorporated herein by reference, the exposure of a wafer to photons (or other particles) decreases wafer charging and will reduce notching.

Although various embodiments which incorporate the teachings of the present invention have been shown and described in detail herein, those skilled in the art can readily devise many other varied embodiments that still incorporate these teachings.

What is claimed is:

1. A method of reducing copper-induced residue produced during an aluminum etch process comprising the steps of:

plasma etching a semiconductor wafer having a predominantly aluminum layer thereon; and exposing the semiconductor wafer to photons that facilitate the reduction of copper-induced residue.

2. The method of claim 1, wherein the photons have a wavelength in a frequency band selected from the group of infrared, ultraviolet, vacuum ultraviolet, and visible or a combination thereof.

3. The method of claim 1, wherein the photons are produced by a lamp.

4. The method of claim 1, wherein the photons are produced by adding chemicals to the plasma.

5. The method of claim 1, wherein the exposing step is performed during the plasma etching.

6. The method of claim 1, wherein the plasma etching is performed by a chlorine based chemistry.

7. The method of claim 6, wherein the exposing step promotes photodesorption of copper chloride.

8. The method of claim 7, wherein the copper chloride is desporbed as a gas.

9. The method of claim 1 further comprising one or more steps selected from a group of steps consisting of adjusting the intensity of photons, energy of photons, or total number of photons.

10. The method of claim 1 wherein the improvement of the process further comprises the improvement selected from the group consisting of:

increasing resist selectivity, decreasing striation during etching, improving aspect ratio etching, substantially eliminating charging damage, decreasing profile notching induced by charging damage, improving profile control, decreasing microloading, mitigating gap fill difficulties, improving etch rates, improving selectivity of oxides over silicon and silicon nitride, in-situ hardening of photoresist, increasing the mean time between cleanings, and decreasing copper-induced residue.

11. A method of reducing copper-induced residue during an etching process comprising the steps of:

forming a plasma from a gas comprising organic ligands;

etching a layer on a semiconductor wafer using a chlorine-based chemistry that forms copper chloride; and exposing the semiconductor wafer to photons that photodesorb the copper chloride.

12. The method of claim 11, wherein the copper chloride is desorbed as a gas.

13. The method of claim 11, wherein the photons have a wavelength in a frequency band selected from the group of infrared, ultraviolet, vacuum ultraviolet, and visible or a combination thereof.

14. The method of claim 11, wherein the photons are produced by a lamp.

15. The method of claim 11, wherein the exposing step is performed during plasma etching.

16. The method of claim 11, wherein the etch step comprises etching a predominantly aluminum layer.

17. The method of claim 11, wherein the etch step comprises etching a predominantly copper layer.

18. The method of claim 11 wherein the exposing step further comprises an improvement selected from the group consisting of:

increasing resist selectivity, decreasing striation during etching, improving aspect ratio etching, substantially eliminating charging damage, decreasing profile notching induced by charging damage, improving profile control, decreasing micrcoloading, mitigating gap fill: difficulties, improving etch rates, improving selectivity of oxides over silicon and silicon nitride, in-situ hardening of photoresist, increasing the mean time between cleanings, and decreasing copper-induced residue.

19. A computer-readable medium having stored thereon a plurality of instructions, the plurality of instructions including instructions which, when executed by a computer, cause the computer to control a semiconductor wafer processing chamber to perform the steps of:

plasma etching a semiconductor wafer a predominantly aluminum layer thereon; and exposing the semiconductor wafer to photons that facilitate the reduction of copper-induced residue.

20. The medium of claim 19, wherein the photons have a wavelength in a frequency band selected from the group of infrared, ultraviolet, vacuum ultraviolet, and visible or a combination thereof.

21. The medium of claim 19, wherein the photons are produced by a lamp.

22. The medium of claim 19, wherein the exposing step of the method comprises the step of introducing organic ligands to the plasma.

23. The method of claim 22, wherein the photons reacted with the organic ligands improves the process plasma performance.

24. The method of claim 19, wherein the semiconductor wafer further comprises a layer selected from the group of materials consisting of aluminum, tungsten, tungsten silicide, silicon, silicon dioxide, silicon nitride, silicon oxynitride, photoresist, titanium, titanium nitride, taptalum, tantalum nitride.

25. The method of claim 19, wherein the exposing step promotes photochemical desorption of a material that would otherwise interfere with processing of a layer disposed on said semiconductor wafer.

26. The method of claim 25, wherein the material is desporbed as a gas.

27. The method of claim 19, wherein the exposing step results in an improvement of the process selected from the group consisting of:

increasing resist selectivity, decreasing striation during etching, improving aspect ratio etching, substantially eliminating charging damage, decreasing profile notching induced by charging damage, improving profile control, decreasing microloading, mitigating gap fill difficulties, improving etch rates, improving selectivity of oxides over silicon and silicon nitride, in-situ hardening of photoresist, increasing the mean time between cleanings, and decreasing copper-induced residue.

28. The medium of claim 19, wherein the exposing step occurs during the plasma processing.

* * * * *